United States Patent [19]

Hirose et al.

[11] Patent Number: 5,203,959

[45] Date of Patent: * Apr. 20, 1993

[54] MICROWAVE PLASMA ETCHING AND DEPOSITION METHOD EMPLOYING FIRST AND SECOND MAGNETIC FIELDS

[75] Inventors: Naoki Hirose; Takashi Inujima; Toru Takayama, all of Atsugi, Japan

[73] Assignee: Semiconductor Energy Laboratory Co., Ltd., Atsugi, Japan

[*] Notice: The portion of the term of this patent subsequent to Aug. 13, 2008 has been disclaimed.

[21] Appl. No.: 766,283

[22] Filed: Sep. 27, 1991

Related U.S. Application Data

[60] Continuation of Ser. No. 461,938, Jan. 8, 1990, abandoned, which is a division of Ser. No. 186,219, Apr. 26, 1988, Pat. No. 4,926,791.

[30] Foreign Application Priority Data

Apr. 27, 1987 [JP] Japan .................. 62-104024
Apr. 27, 1987 [JP] Japan .................. 62-104025

[51] Int. Cl.$^5$ .............................................. B05D 3/06
[52] U.S. Cl. ............................ 156/643; 156/646; 427/571; 427/577; 427/575
[58] Field of Search ............ 427/37, 47, 45.1, 38; 118/723, 728, 729, 715; 156/643, 646

[56] References Cited

U.S. PATENT DOCUMENTS

| | | | |
|---|---|---|---|
| 4,125,431 | 11/1978 | Fowler | 176/3 |
| 4,354,999 | 10/1982 | Priest | 376/142 |
| 4,434,188 | 2/1984 | Kamo et al. | 427/39 |
| 4,727,293 | 2/1988 | Asmussen et al. | 427/39 |
| 4,778,561 | 10/1988 | Ghanbani | 427/38 |
| 4,926,791 | 5/1990 | Hirose et al. | 427/45.1 |
| 4,960,073 | 10/1990 | Suzuki et al. | 315/111.41 |
| 4,973,883 | 10/1990 | Hirose et al. | 118/723 |
| 5,039,548 | 8/1991 | Hirose et al. | 118/723 |

FOREIGN PATENT DOCUMENTS 0213377 9/1986 Japan .
0030891 2/1987 Japan .

OTHER PUBLICATIONS

Bachmann et al., "Emerging Technology of Diamond Thin Films" C & EN p. 32 1989.
Y. Arnal et al., "Plasma Etching in Magneric Multipole Microwave Discharge", Appl. Phys. Lett. 45(2) 15 Jul. 84, pp. 132-134.

Primary Examiner—Shrive Beck
Assistant Examiner—Benjamin L. Utech
Attorney, Agent, or Firm—Sixbey, Friedman, Leedom & Ferguson

[57] ABSTRACT

A plasma processing apparatus and method is equipped with a vacuum chamber, helmoltz coils, Ioffe bars, a microwave generator and gas feeding systems. An auxiliary magnet is further provided in order to strengthen the magnetic field in the vacuum chamber to produce centrifugal drifting force which confine the plasma gas about the center position of the vacuum chamber. Specifically, the method includes establishing a first magnetic field in the vacuum chamber substantially parallel to the direction of propagation of microwaves emitted in the chamber and establishing a second magnetic field substantially perpendicular to the first magnetic field. A substrate in the chamber for plasma processing is placed so that a surface of the substrate is substantially perpendicular to the direction of the first magnetic field and parallel to the direction of the second.

15 Claims, 6 Drawing Sheets

MICROWAVE PLASMA ETCHING AND DEPOSITION METHOD EMPLOYING FIRST AND SECOND MAGNETIC FIELDS

This application is a continuation of Ser. No. 07/461,938, filed Jan. 8, 1990, now abandoned, which itself was a divisional of application Ser. No. 07/186,219, filed Apr. 26, 1988, now U.S. Pat. No. 4,926,791.

BACKGROUND OF THE INVENTION

This invention relates to a plasma processing apparatus and method.

There have been known the ECR CVD for depositing thin films on a substrate. In this deposition method, a substrate may be placed in a vacuum chamber apart from the resonating space and a thin film such as an amorphous film is formed on the substrate by virtue of a divergent magnetic field induced in the vacuum chamber.

The ECR CVD can be performed in combination with other known deposition methods such as heated filament CVD, chemical transportation method, plasma CVD making use of a high frequency power at 13.56 MHz, microwave-assisted CVD. In accordance with this method, a reactive gas is confined and excited by supplying a microwave under a magnetic field in accordance with the electron cycrotron resonance. The excited reactive gas is drifted to a substrate which is located at a position remote from the resonating space. At the remote position, the excited gas is deposited on the substrate or attacks the substrate to effect anisotropic etching. The pressure in the chamber during process has been maintained at a relatively low pressure, e.g. of the order of $10^{-4}$ Torr. Because of this, it is very difficult to form a highly crystallized film such as a diamond film and to choose the process condition with a broad flexibility.

SUMMARY OF THE INVENTION

It is therefore an object of the invention to provide a plasma processing apparatus and method in which a highly energized plasma gas is confined about the center position at which a substrate to be processed is disposed.

It is therefore an object of the invention to provide a plasma processing apparatus and method in which highly crystallized films can be deposited under flexible conditions.

According to one aspect of the invention, an auxiliary magnet is provided in addition to a main magnet which produces a magnetic field parallel with the microwave propagating direction allowing the plasma gas to resonate with the microwave. The auxiliary magnet is located along the wall of the reaction chamber for the purpose of enhancing the strength of magnetic field at the periphery of the reaction chamber. Since charged particles are subjected to a drifting force proportional to the negative of the gradient of the absolute strength of the magnetic field, plasma gas is confined in the center by virtue of the additional magnetic field induced by the auxiliary magnet.

The resonance taking place in the reaction chamber includes the electron cycrotron resonance, the whistler mode resonace, or other types resonance which are caused by supplying a microwave under a magnetic field such as the mixed cyclotron resonance. By virtue of such a resonance, a highly energized plasma gas having its high density is obtained. In case of carbon deposition, a highly energized plasma produces a large amount of excited carbon atoms and the high reproducibility is achieved.

In accordance with the most broad concept, it is noted that the present invention is also effective in case of thermal CVD, photo-assisted CVD or so forth in which no magnetic field is utilized. The reactive gas is confined in the vicinity where deposition is desired in the other deposition systems.

BRIEF DESCRIPTION OF THE INVENTION

FIG. 1 is a schematic diagram showing a plasma processing apparatus in accordance with the present invention.

FIGS. 2(A) and 2(B) are a cross sectional view and a side elevation view showing Ioffe bars for use in accordance with the present invention.

Figure 6A:
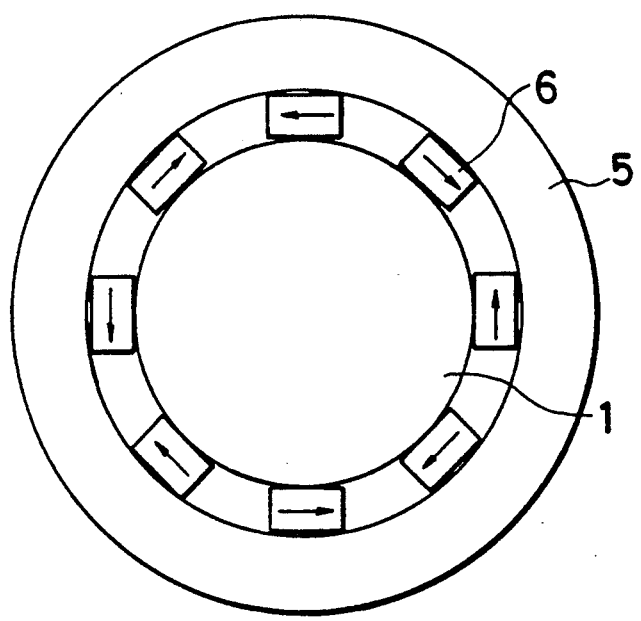
Figure 6B:
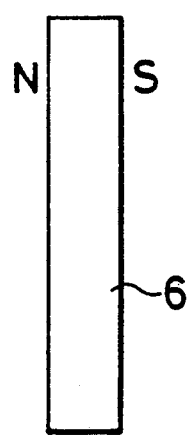

FIGS. 6(A) and 6(B) are a cross sectional view and a side elevation view showing Ioffe bars of another type for use in accordance with the present invention.

Figure 7:
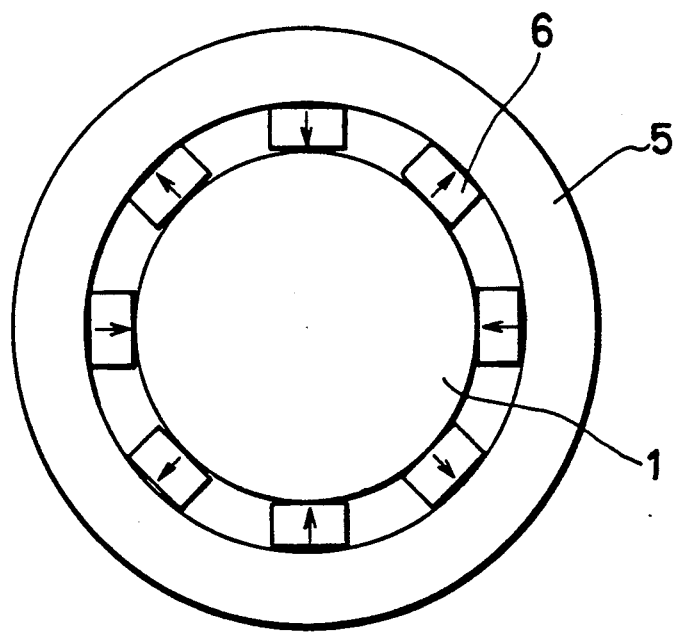

FIG. 7 is a cross sectional view Ioffe bars of a further type for use in accordance with the present invention.

DETAILED DESCRIPTION OF THE PREFERRED EMBODIMENTS

Figure 1:
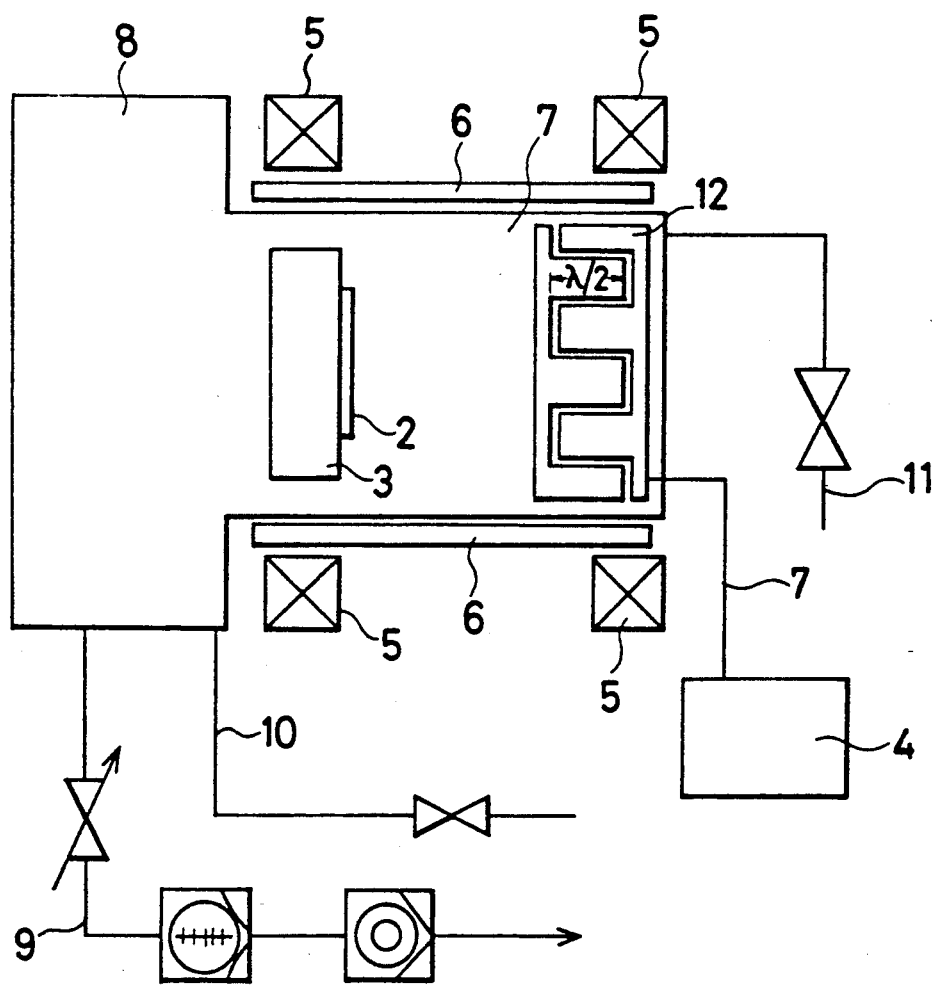

Referring to FIG. 1, a microwave assisted plasma CVD apparatus in accordance with the present invention is illustrated. In the figure, the apparatus comprises a reaction vacuum chamber 1 defining a resonating space therein, a loading chamber 8 connected with the vacuum chamber 1, a substrate holder 3 capable of carrying a substrate 2 to be treated, helmholtz coils 5 around the reaction chamber 1, an auxiliary electromagneto 6 located inside of the helmholtz coils around the reaction chamber, a microwave generator 4 connected to the reaction chamber 1 through a waveguide 7, an evacuating system 9, and gas feeding systems 10 and 11. The holder 3 is made of a highly thermal conductive material, such as aluminium nitride, which does not substantially disturb the microwave transmission from a microwave introduction window 12.

Figure 2A:
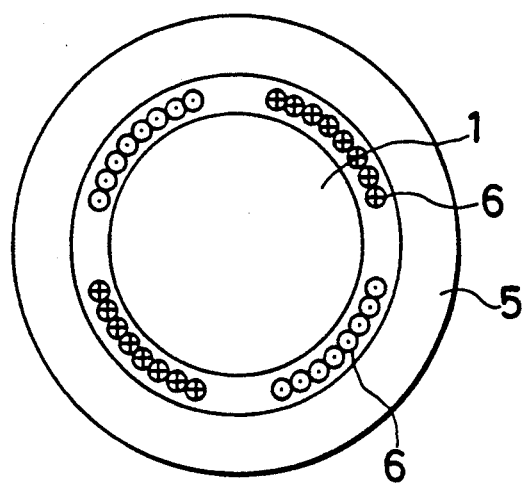
Figure 2B:
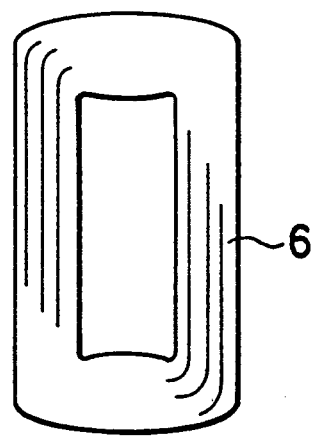
Figure 3:
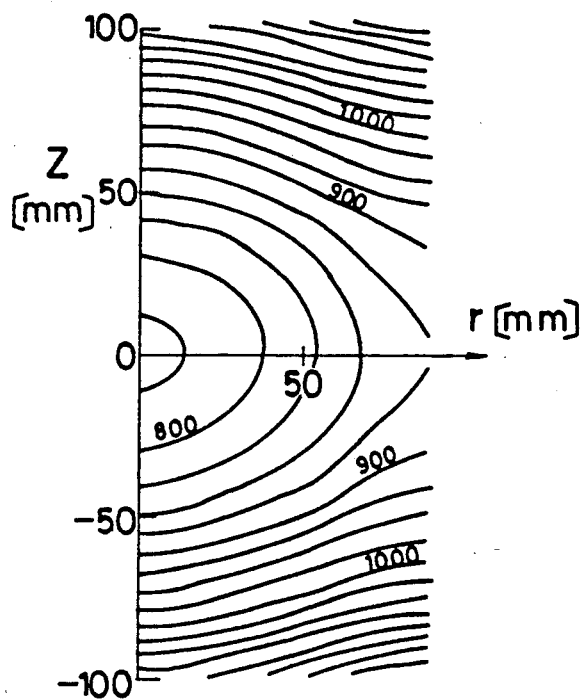
FIG. 3 is a graphical diagram showing the strength of magnetic field in a reaction chamber in accordance with the present invention.
Figure 4:
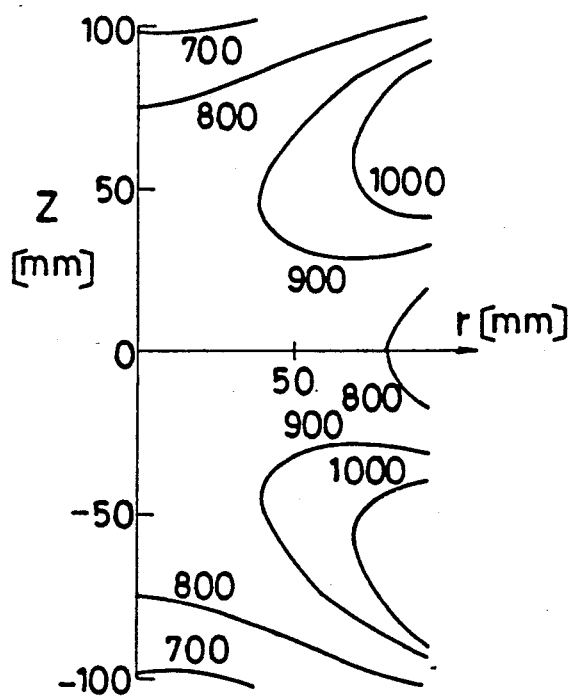
FIG. 4 is a graphical diagram showing the strength of magnetic field induced only by helmholtz coils in a reaction chamber.

The auxiliary magnet 6 consists of two electromagnets providing Ioffe bars which extend in the direction of the microwave propagation (FIGS. 2(A) and 2(B)). In FIG. 2(A), the end marks of arrow denote the current passing direction of each bar. The object of the provision of the Ioffe bars is to strengthen the strength of magnetic field near the cylindrical wall of the reaction chamber 1. FIG. 3 is a graphical diagram showing surfaces on each of which the strength of the magnetic field is constant. The abscissa is the distance (r) from the axis of the cylindrical reaction chamber and the ordinate is the axial distance from the center plane of the helmholtz coils 5. The figure given to each surface denotes the strength (Gauss) of the magnetic field on that surface. As shown in the diagram, the strength of the magnetic field takes a larger value at a nearer position to the cylindrical wall, so that the drifted force exerted on the plasma is alwalys centrifugal. The magnetic field is weakest on the axis of the cylindrical reaction chamber. FIG. 4 is a graphical diagram showing the surfaces on which the magnetic field is constant when the auxiliary magnet is not used.

Next, the deposition process with this apparatus will be described. A substrate 2 is mounted on the holder 3 and disposed at an appropriate position in the reaction chamber 1 where the microwave and the magnetic field satisfy the ECR condition. After evacuating the reaction chamber 1, the substrate 1 is heated to 500° C. and hydrogen gas is leaked into the chamber 1 at 10 SCCM through the gas feeding system 11. The introduced hydrogen gas is energized into a plasma gas by virtue of a 2.45 microwave emitted from the generator 4 and a magnetic field induced by both the helmholtz coils 5 and the auxiliary magnet 6. The strength of the portion of the magnetic field that is induced by the coils 5 is about 2K Gauss at the resonating space (a partion of the reaction chamber). The pressure in the resonating space is maintained at 0.1 Pascal. The surface of the substrate is cleaned by virtue of the plasma.

Then, the introduction of hydrogen is halted and a carbon compound gas such as $C_2H_2$ or $CH_4$ is introduced into the reaction chamber 1 and excited in the same way as hydrogen as explained above. By this process, a diamond or i-carbon film is deposited on the substrate which has been heated to about 500° C. According to experiment, diamond films were deposited particularly when the substrate temperatures were higher than 650° C.

In accordance with the electron beam diffraction analysis, a halo pattern was observed at a relative low temperature together with a spot pattern which is peculiar to amorphous structures. Such an image indicates the presence of i-carbon. In halo pattern gradually differed as the substrate temperature was elevated. When the substrate temperature was elevated higher than 650° C., the deposited film became composed mainly of diamond. The diamond film was confirmed by obtaining its Raman spectrum. The spectrum includes a moderate peak near 1500 $cm^{-1}$ and a sharp peak near 1333 $cm^{-1}$.

For reference, the same process was repeated without inducing a magnetic field in the reaction chamber. The film thus deposited was made of graphite. Even with the presence of magnetic field, no i-carbon film could not be deposited on a substrate at a temperature lower than 150° C.

The above process can be applied to a method of depositing polycrystalline silicon carbide films by making use of silicon carbide gaseous compounds as the reactive gas, to a method of depositing aluminium nitride films by making use of a reactive gas consisting of an aluminium compound gas and ammonia, and a method of depositing films having a high melting point, e.g. films made of tungsten, titanium and molybdeum or their silicon compounds. In the same way, the present invention can be applied for the deposition of BN, CN, TiN and BP.

Figure 5:
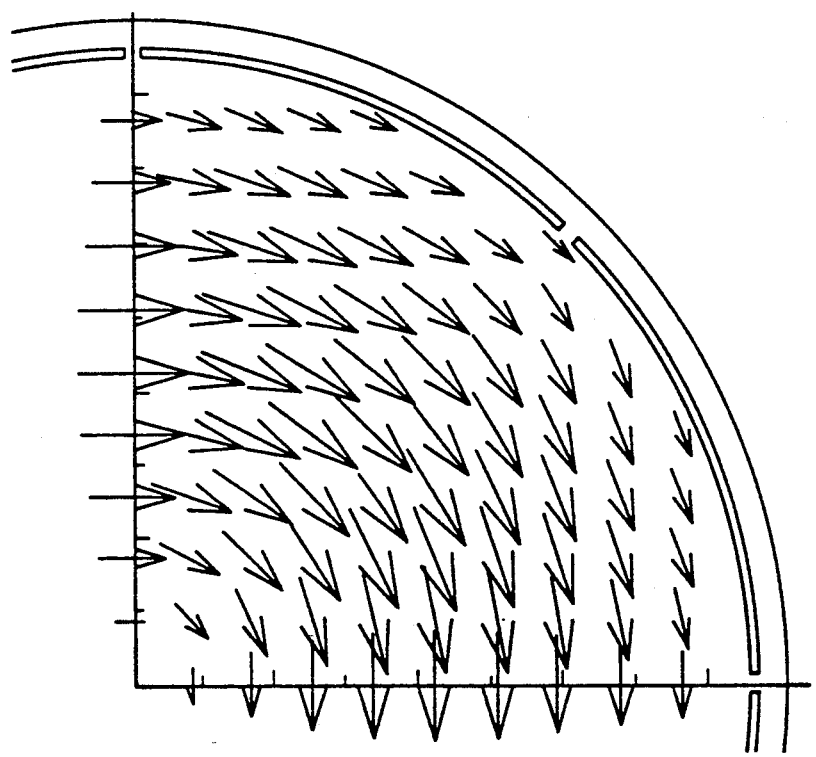
FIG. 5 is a schematic diagram showing another plasma processing apparatus in accordance with the present invention.

FIG. 5 a schematic veiw showing another type of plasma processing apparatus. This apparatus is largely same as the above explained apparatus besides the relationship between the the helmholtz coils 5 and the connection position of the waveguide 7 to the reaction chamber 1. In the arrangement, it is very important that a microwave is mixed with a reactive gas only in the left side of the center surface C between he helmholtz coils 5, so that the reactive gas is subjected to the magnetic field that monotonically decreases toward the left in the resonating space. The magnetic field functions to drift the plasma gas to the substrate 2 and prevent the gas from producing deposition on the right side wall.

The Ioffe magnet may be another type magnet. FIGS. 6(A) and 6(B) are drafted in correspondence with FIGS. 2(A) and 2(B) to show another type of Ioffe magnet sutable for use in accordance with the invention. As shown in the figure, a plurality of rod-shaped permanent magnets are arranged immediately inside of the helmholz coils 5 with their magnetic moments directed to the circumferential direction as indicated by arrows. The magnetic moments can be arranged in the axial direction as shown in FIG. 7.

While a description has been made for several embodiments, the present invention should be limited only by the appended claims and should not be limited by the particular examples. What follows are some examples of modifications and variation according to the invention. By adding oxygen, water or the like to the reactive gas, the crystallinity of the deposited film can be enhanced. By irradiating the exciting plasma gas with ultraviolet rays between the resonating space and the substrate to be coated, the exciting plasma gas can hold its energy even substantially distant from the resonating space. For instance, a diamond or i-carbon film can be deposited on a large area. Also, by applying a DC bias voltage to the exciting plasma, a larger amount plasma reaches the substrate enabling a high deposition speed. Also, as easily understood by those skilled in the art, the present invention is effective when used for plasma etching, particularly by making use of ECR. The etchant gas is confined by virtue of the magnetic field in the same way as explained above.

We claim:

1. A cyclotron resonance plasma processing method comprising:
   placing a substrate in a reaction chamber;
   introducing a reactive gas into said reaction chamber;
   emitting microwaves into said reaction chamber;
   establishing a first magnetic field in said reaction chamber by virtue of an electromagnetic coil surrounding said reaction chamber where the direction of the magnetic field is substantially parallel to the direction of propagation of the microwaves;
   establishing a cyclotron resonance by virtue of said microwaves and said first magnetic field, thereby converting said reactive gas into a plasma;
   establishing a second magnetic field by virtue of ioffe bars placed around said reaction chamber where the direction of said second magnetic field is perpendicular to said first magnetic field in order to confine said plasma inside the reaction chamber; and
   carrying out a plasma processing including etching or deposition with said plasma gas on said substrate.

2. The method of claim 1 wherein said plasma processing is an etching process.

3. The method of claim 1 wherein said plasma processing is a deposition process.

4. The method of claim 3 wherein said reactive gas includes a hydrocarbon gas and a carbon material including diamond is deposited on said substrate by said plasma processing.

5. The method of claim 3 wherein said deposition process forms a film selected from the group consisting of BN, CN, TiN and BP.

6. The method of claim 1 wherein said substrate is biassed with a DC voltage in order that charged particles in the plasma is accelerated toward the substrate.

7. A method for forming a carbon material including diamond on a substrate comprising the steps of:
placing said substrate in a reaction chamber;
introducing a reactive gas including a hydrocarbon gas into said reaction chamber;
emitting microwaves into said reaction chamber;
establishing a first magnetic field in said reaction chamber by virtue of an electromagnetic coil surrounding said reaction chamber where the direction of the magnetic field is substantially parallel to the direction of propagation of the microwaves;
producing a plasma gas by resonance between said reactive gas and the microwaves by virtue of said first magnetic field;
establishing a second magnetic field in order to pinch said plasma near the substrate; and
forming a carbon material including diamond on said substrate by virtue of said plasma.

8. The method of claim 7 wherein said second magnetic field is established by virtue of ioffe bars placed around said reaction chamber.

9. The method of claim 7 wherein said substrate is biassed with a DC voltage in order that charged particles in the plasma is accelerated toward the substrate.

10. A cyclotron resonance plasma processing method comprising:
placing a substrate in a reaction chamber;
introducing a reactive gas into said reaction chamber;
emitting microwaves into said reaction chamber;
establishing a first magnetic field in said reaction chamber by virtue of an electromagnetic coil surrounding said reaction chamber where the direction of the magnetic field is substantially parallel to the direction of propagation of the microwaves;
establishing a cyclotron resonance by virtue of said microwaves and said first magnetic field, thereby converting said reactive gas into a plasma;
establishing a second magnetic field by virtue of ioffe bars placed around said reaction chamber where the direction of said second magnetic field is perpendicular to said first magnetic field in order to confine said plasma inside the reaction chamber; and
carrying out a plasma processing including etching or deposition with said plasma gas on said substrate,
wherein said substrate is placed in said reaction chamber so that a surface of the substrate is substantially perpendicular to the direction of the first magnetic field and substantially parallel to the direction of the second magnetic field.

11. The method of claim 10 wherein said plasma processing is an etching process.

12. The method of claim 10 wherein said plasma processing is a deposition process.

13. The method of claim 12 wherein said reactive gas includes a hydrocarbon gas and a carbon material including diamond is deposited on said substrate by said plasma processing.

14. The method of claim 12 wherein said deposition process is to form a deposit selected from the group of BN, CN, TiN and BP.

15. The method of claim 10 wherein said substrate is biassed with a DC voltage in order that charged particles in the plasma are accelerated toward the substrate.

* * * * *